(12) United States Patent
Lasser

(10) Patent No.: US 7,464,193 B2
(45) Date of Patent: Dec. 9, 2008

(54) DEVICE AND METHOD FOR CONFIGURING A FLASH MEMORY CONTROLLER

(75) Inventor: Menahem Lasser, Kohav Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 413 days.

(21) Appl. No.: 11/288,164

(22) Filed: Nov. 29, 2005

(65) Prior Publication Data

US 2007/0061501 A1  Mar. 15, 2007

Related U.S. Application Data

(60) Provisional application No. 60/712,017, filed on Aug. 29, 2005.

(51) Int. Cl.
*G06F 3/00* (2006.01)
(52) U.S. Cl. ............... 710/11; 710/8; 710/10; 710/62; 710/74; 711/103; 711/170
(58) Field of Classification Search ............ None
See application file for complete search history.

(56) References Cited

U.S. PATENT DOCUMENTS

| | | | |
|---|---|---|---|
| 7,376,773 B2 * | 5/2008 | Kim et al. | 710/74 |
| 7,406,572 B1 * | 7/2008 | Nguyen | 711/154 |
| 2003/0079077 A1 * | 4/2003 | Piau et al. | 711/103 |
| 2003/0090939 A1 | 5/2003 | Perroni et al. | |
| 2004/0039854 A1 | 2/2004 | Estakhri et al. | |
| 2005/0060486 A1 | 3/2005 | Kang et al. | |
| 2006/0177064 A1 | 8/2006 | Holtzman et al | |
| 2007/0108300 A1 * | 5/2007 | Son et al. | 235/492 |

* cited by examiner

*Primary Examiner*—Eron J Sorrell
(74) *Attorney, Agent, or Firm*—Mark M. Friedman

(57) ABSTRACT

A storage device and method for flexibly configuring a flash memory controller. The device includes a flash memory array containing a plurality of memory cells, wherein at least two configuration bits are programmed to the plurality of memory cells. A controller having at least one configuration pin is further provided for controlling the flash memory array by selecting one interface channel for connection to an external host, according to the values of the configuration bits and/or the voltage level(s) on the configuration pin(s). A "flag" corresponding to each of the interface channels is further provided, thus defining which of said interface channels is operable.

18 Claims, 3 Drawing Sheets

DEVICE AND METHOD FOR CONFIGURING A FLASH MEMORY CONTROLLER

CROSS-REFERENCE TO RELATED APPLICATIONS

This patent application claims the benefit of U.S. Provisional Patent Application No. 60/712,017, filed Aug. 29, 2005.

FIELD OF THE INVENTION

The present invention relates generally to a method and device for flexibly configuring an integrated circuit. More particularly, the present invention relates to a method and device for flexibly configuring a flash memory controller.

BACKGROUND OF THE INVENTION

Electronic systems typically comprise a Central Processing Unit (CPU), that is the main processing element of the system, and a few peripheral elements that provide some other functionality to the system. Examples for peripheral elements are memories of various types (flash memories, magnetic disks, etc.), display means, communication means, and more.

Many peripheral elements require a controlling mechanism to manage and control their operation and their interaction with the CPU. For example, NAND-type flash memories are not straight-forward to use and to interface to and therefore require such a controlling mechanism. In some systems the CPU chip contains an integrated controller for providing such a controlling mechanism for a NAND-type flash memory. In other systems, the CPU does not contain an integrated controller for that purpose, and therefore the system designer must provide a controlling mechanism implemented separately from the CPU that interfaces with both the CPU and the NAND-type flash memory.

Many controllers are designed to support one specific interface for connection with the CPU. For example, there are many commercially available NAND-type flash memory controllers that support a USB interface for connection with the CPU. In order to operate such controller, the CPU must support a matching USB interface channel that is connected to the USB interface of the controller. As another example, there are many NAND-type flash memory controllers that support a Multi Media Card (MMC) interface for connection with the CPU. In order to operate such controller, the CPU must support a matching MMC interface channel that is connected to the MMC interface of the controller.

However, many controllers are configured to support multiple types of interfaces, e.g. USB and MMC interfaces, for connection with the CPU. Configuring such controllers provide the system designer with extra flexibility, as he can choose which interface to use according to the types of interface channels available in the CPU or according to desired characteristics of the interface, such as speed of operation.

Note that typically only a single interface is operative at any given system, even though the same controller is configured to support different types of interface channels when connected to different systems. This is a great advantage from a logistic point of view, since a single stored Integrated Circuit (IC) is provided to support a plurality of interface channels when connected to many different systems.

However, as those multi-interface controllers can support multiple operation modes (herein we refer to the use of each interface as a "mode"), the desired interface channel must be configured in the system it is currently installed in during system power-up. If this is not properly done, a controller may operate in a USB-interface mode while the CPU only supports the MMC interface, with the result that the system will fail to operate correctly.

Several approaches known in the art are provided for configuring multi-interface controllers, trying to overcome this problem. Such approaches include configuration pins and non-volatile memory configuration bits:

A. Configuration pins—The IC controller has one or more pins that are used during system power-up for selecting the desired interface channel. For example, in a controller that supports the two USB and MMC interface channels, a single pin is assigned for interface channel selection. At power-up, the internal circuitry within the controller measures the input voltage level set at this pin. If it is at one state (e.g. logical "0")—the USB mode is selected, and if it is at another state (e.g. logical "1")—the MMC mode is selected. In case there are more than two modes to select from, then more than one pin is used.

It should be noted that such configuration pins are not necessarily used only for the configuration function of selecting the desired interface. As the interface decision has to be taken only at system power-up time, the configuration pins may later be used for other functionalities during the controller's normal operation.

In order to configure a controller by implementing configuration pins, the system designer should make sure that required voltage levels are applied to the configuration pins during system power-up. This can be done by providing a fixed wiring on the Printed Circuit Board—PCB (in case the configuration pins are not also used for another purpose), or by implementing an electronic circuitry that applies the required voltage levels to the configuration pins at system power-up but can be later on disconnected from the configuration pins.

However, the above configuration method of configuration pins has its disadvantages. The main disadvantage that arises when applying the configuration pins method is that the selection of the configuration mode is completely in the hands of the user using the controller and is not controlled by the controller's manufacturer. It is the designer of the system using the controller that decides on the PCB wiring and therefore on the mode in which the controller operates.

This is not desirable for the controller's manufacturer because it limits his options, such as offering different interfaces at different prices, etc. For example, if competing USB controllers are of low cost in the market while competing MMC controllers are expensive, it would be advantageous for the manufacturer to charge customers more for getting support via the MMC mode than via the USB mode. But by applying the configuration pins method this is not possible, since all controllers are configured "without an identity", and only the customer configure the controller's operation mode.

Another example to the limitations of this method occurs when the use of one of the interfaces requires the payment of a licensing fee. In such a case, a customer which elects to not pay the fee and not get the license is not blocked from violating the manufacturer's rights by configuring the controller to use the non-licensed mode.

B. Non-volatile memory configuration bits—The desired configuration mode is coded into a non-volatile memory that is read by the controller at system power-up time. For example, if the controller controls a NAND-type flash memory, one can assign the first byte of the first page of the first block of the flash memory address space to contain the configuration bits.

For example, in a controller that supports the two modes of USB and MMC, a single bit is assigned for mode selection. At system power-up an internal circuitry within the controller reads the value stored in the configuration bit. If it is at one state (e.g. logical. "0")—USB mode is selected, and if it is at another state (e.g. logical "1")—the MMC mode is selected. In case there are more than two modes to select from, then more than one bit is used.

In order to configure a controller by implementing non-volatile memory configuration bits, the system designer should make sure that required data is stored in the configuration bits. This is typically achieved by programming the data into the flash memory during the manufacturing process of the system.

As fresh and unused flash memory cells typically have a logical "1" stored in every bit position, the default configuration in the above example supports the MMC interface. Therefore, if the system designer wants the controller to support the USB mode, he can program the flash memory at an earlier manufacturing stage (before it is assembled with the controller). another way is to temporarily use an MMC channel for accessing the controller and instruct it to write the configuration bits into the flash memory, and then shut down the system and power it up again, so that the controller will then wake up to support the USB mode.

According to the non-volatile memory configuration bits method, the configuration bits are accessible only to the controller's manufacturer and not to the customer (e.g. when the controller and the flash memory are sold already assembled together as one unit). Therefore, the manufacturer retains complete control of the configuration mode. In other words, if the manufacturer configured the configuration bits for supporting a certain interface, he is guaranteed that the customer cannot change this interface. Therefore, different pricing for different modes, or the blocking of a non-licensed mode are both possible.

However, such policy results in a loss of manufacturing flexibility. Each interface mode becomes a separate item, with its own part number and stock to be kept. If the manufacturer still wants some customers (or his manufacturing facility) to enjoy the flexibility provided by the configuration pins method, this is not available any more.

Thus, it would be highly advantageous to provide a method and system for flexibly configuring a flash memory controller, such that the advantages of both prior art methods mentioned above are retained at the same time.

SUMMARY OF THE INVENTION

Accordingly, it is a principal object of the present invention to overcome the disadvantages of prior art techniques used for flexibly configuring a flash memory controller.

The proposed method relies on the use of non-volatile configuration bits while employing one or more configuration pins for selecting a desired interface channel.

A controller supporting multi interface channels is provided for controlling a flash memory array and selecting a desired interface channel from a plurality of interface channels for connection to an external host (e.g. CPU). The desired interface channel is selected according to the non-volatile configuration bits and the voltage level set at the configuration pins.

In accordance with a preferred embodiment of the present invention, there is provided a storage device and method comprising:

a flash memory array containing a plurality of memory cells, wherein at least two configuration bits are programmed to the plurality of memory cells; and a controller for controlling the flash memory array, the controller comprising at least one configuration pin, wherein the controller supporting a plurality of interface channels for connection to an external host, wherein the controller is operative to select one interface channel from the plurality of interface channels, such that if a value of the at least two configuration bits is from a first group of at least one predetermined value then the interface channel is selected at least in part according to voltage levels measured at the at least one configuration pin, whereas if the value is from a second group of at least one predetermined value then the interface channel is selected at least in part according to values of the at least two configuration bits.

In accordance with another storage device of the present invention, if the value of the at least two configuration bits is from the first group then the interface channel is selected solely according to voltage levels measured at the at least one configuration pin.

In accordance with another storage device of the present invention, if said value of said at least two configuration bits is from said second group then said interface channel is selected solely according to values of said at least two configuration bits.

In accordance with another storage device of the present invention, the first group contains one predetermined value.

In accordance with another storage device of the present invention, the first group contains a plurality of predetermined values.

In accordance with another storage device of the present invention, having a one-to-one correspondence between the selected interface channel and the configuration bits.

In accordance with another storage device of the present invention, each of the plurality of interface channels is provided with a corresponding "flag" defining if each of the plurality of interface channels is operable, such that if the value of the at least two configuration bits is from the first group then the controller is operative to select the one interface channel only from at least one operable interface channel.

In accordance with another storage device of the present invention, the flash memory array and the controller are implemented on a single die.

In accordance with another storage device of the present invention, the flash memory array and the controller are implemented on separate dies.

In accordance with another storage device of the present invention, the flash memory array is a NAND flash memory array.

In accordance with another embodiment of the present invention, there is provided a system comprising:

a host processing unit; and a storage device supporting a plurality of interface channels for connection to the host processing unit, the storage device comprising:

a flash memory array containing a plurality of memory cells, wherein at least two configuration bits are programmed to the plurality of memory cells, a controller for controlling the flash memory, the controller comprising at least one configuration pin, wherein the controller is operative to select one interface channel from the plurality of interface channels, such that if a value of the at least two configuration bits is from a first group of at least one predetermined value then an interface channel is selected at least in part according to voltage levels measured at the at least one configuration pin, whereas if the value is from a second group of at least one predetermined value then the interface channel is selected at least in part according to values of the at least two configuration bits.

In accordance with another embodiment of the present invention, there is provided a method for selling a flash memory device supporting a plurality of interface channels comprising the steps of:

determining a different pricing for different interface channels of the plurality of interface channels; and controlling operation of the flash memory device via one of the plurality of interface channels according to a requested price.

In accordance with another method of the present invention, the one interface channel is selected the said plurality of interface channels according to at least two configuration bits, programmed to a plurality of memory cells, and at least one configuration pin for connection to an external host, wherein if a value of the at least two configuration bits is from a first group of at least one predetermined value then the interface channel is selected at least in part according to voltage levels measured at the at least one configuration pin, whereas if the value is from a second group of at least one predetermined value then the interface channel is selected at least in part according to values of the at least two configuration bits.

In accordance with another method of the present invention, further comprising the step of blocking usage of a non-licensed interface channel.

In accordance with another embodiment of the present invention, further comprising the step of providing complete manufacturing flexibility only to a manufacturer of the flash memory device, but not to the customers.

Additional features and advantages of the invention will become apparent from the following drawings and description.

BRIEF DESCRIPTION OF THE DRAWINGS

For a better understanding of the invention with regard to the embodiments thereof, reference is made to the accompanying drawings, in which like numerals designate corresponding sections or elements throughout, and in which.

DETAILED DESCRIPTION OF THE PREFERRED EMBODIMENTS

Figure 1:
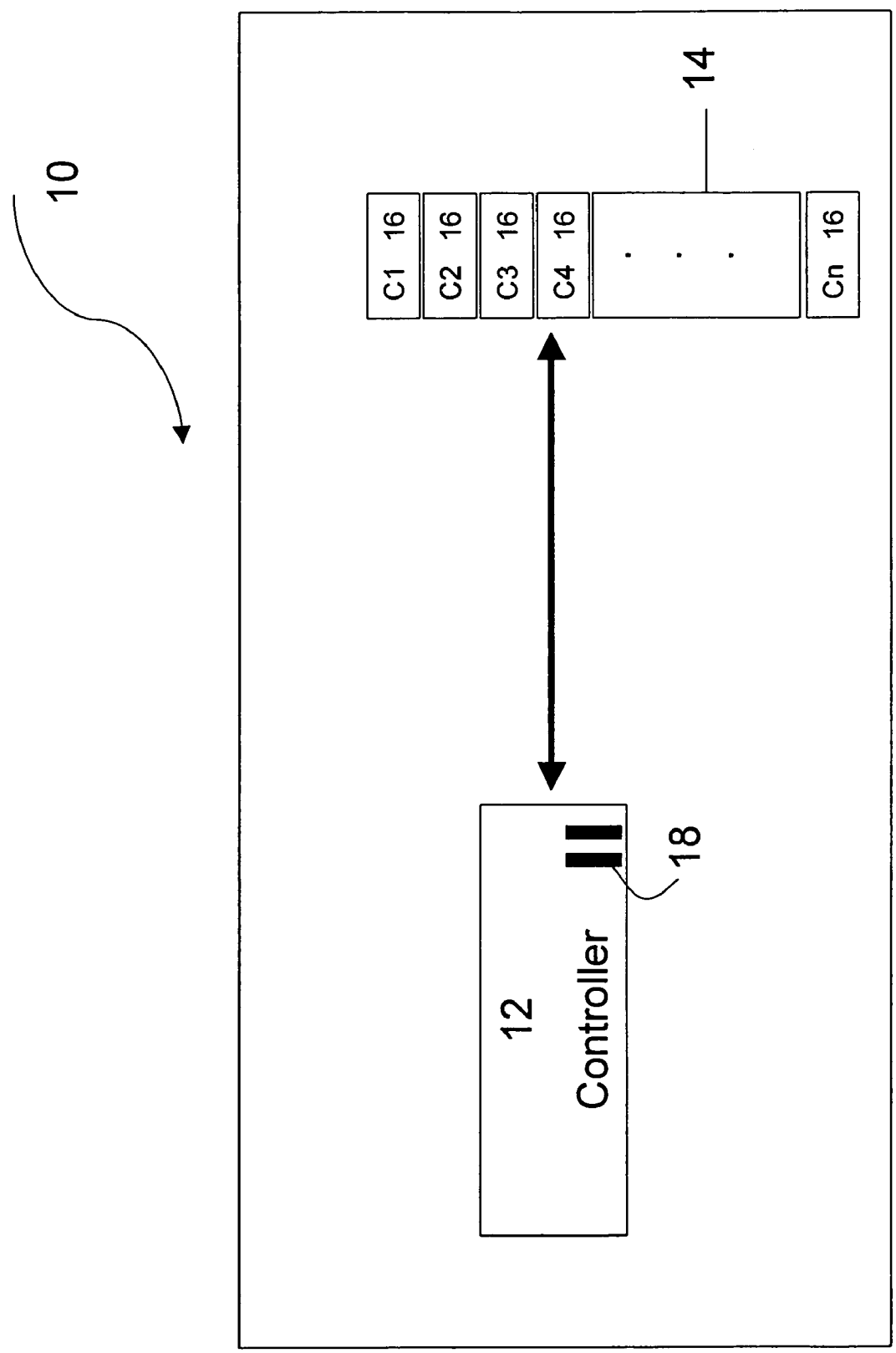
FIG. 1 shows a block diagram of the components comprising the proposed storage device, in accordance with a preferred embodiment of the present invention.

The present invention discloses an innovative storage device and method for flexibly configuring a flash memory controller. The proposed method relies on the use of non-volatile configuration bits while employing one or more configuration pins for selecting a desired interface channel.

A controller supporting multi interface channels is provided for controlling a flash memory array and selecting a desired interface channel from a plurality of interface channels (such as USB, MMC, parallel 8 bit, parallel 16 bits, etc.) for connection to an external host (e.g. CPU). The desired interface channel is selected according to the non-volatile configuration bits and the voltage level set at the configuration pins.

In accordance with a preferred embodiment of the present invention, one of the configuration bits is defined as a selection bit, such that the number of configuration bits is always greater than the number of configuration pins by at least 1. Accordingly, if the value at that selection bit equals a "flexible" value, then the desired interface channel is selected solely according to the voltage level set at the configuration pins (disregarding the non-volatile configuration bits). However, if the value at that selection bit does not equal the "flexible" value, then the desired interface channel is selected solely according to the value of the configuration bits.

For example, in a flash memory array controlled by a controller, configuration bits are programmed to two memory cells of the flash memory array, such that the first memory cell contains a configuration bit defined as a selection bit and the second memory cell contains a configuration bit defining an interface channel. The "flexible" value is defined as '1'. The controller further comprises a configuration pin for defining yet another interface channel.

In case the selection bit is set to 'O', the desired interface channel is selected solely according to the value of the configuration bit within the second memory cell. However, in case the selection bit is set to '1', the desired interface channel is selected solely according to the voltage level at the configuration pin.

Another example is a flash memory array, wherein three configuration bits are programmed and two configuration pins are provided for supporting four different interface channels. The first memory cell contains the selection bit, such that the "flexible" value is defined as '1'. The configuration bit sequence '00' can be set to define a USB interface, the configuration bit sequence '01' can be set to define an MMC interface, the configuration bit sequence '10' can be set to define an SD (Secure Digital) interface, and the configuration bit sequence '11' can be set to define a parallel interface.

In case the selection bit is set to '0', the interface channel is selected solely according to the values of the other two configuration bits. However, in case the selection bit is set to '1', the desired interface channel is selected solely according to the voltage levels at the two configuration pins.

The same encoding setting may further be used for decoding the voltage levels at the configuration pins, as disclosed above for the configuration bits, but this is not mandatory. For example, in case the selection bit is set to '1', then the following encoding setting may be provided—the voltage level '00' may be set at the configuration pins to define a parallel interface, the voltage level '01' may be set to define an SD interface, the voltage level '10' may be set to define an MMC interface, and the voltage level '11' may be set to define a USB interface.

In accordance with yet a second embodiment of the present invention, each interface channel is provided with a corresponding "flag" defining if the interface channel is operable and available for selection.

In case the selection bit is set to the other "non-flexible" value, then a desired interface channel is selected from the operable interface channel/s according to the voltage level set at the configuration pins. Hence, the user is authorized to operate the controller via one interface channel selected from any of the operable interface channel/s. Operation of the controller via any other interface channel will not be enabled. However, in case the selection bit is set to the "flexible" value, then the desired interface channel is selected according to the voltage level at the configuration pins, wherein no restrictions are imposed on the selection.

For example, in a flash memory array controlled by a controller, configuration bits are programmed to six memory cells of the flash memory array, such that the first memory cell contains a configuration bit defined as a selection bit and the remaining five memory cells contain configuration bits defining a plurality of interface channels. A "flag" relating to each of the five remaining memory cells is provided for defining the operable interface channels, such that the flags relating to the second and third memory cells are set to '1' in order to indicate that the corresponding two interfaces are operable, and the flags relating to the fourth, fifth and sixth memory cells are set to '0' in order to indicate that the corresponding three interfaces are not operable. The "flexible" value is defined as '1'. The controller further comprises three configuration pins, for selection between the plurality of operable interface channels.

If the selection bit is set to '0', then the selection bit equals the "non-flexible" value. In such a case, the desired interface channel is selected from the operable interface channel/s (corresponding to the second and third memory cells) according to the voltage levels set at the configuration pins, not allowing the selection of a channel that is not operable. However, if the selection bit is set to '1', then the controller operates via a desired interface channel according to the voltage level at the configuration pins, with no restrictions imposed on the selection.

In accordance with yet a third embodiment of the present invention, the desired interface channel is selected according to the overall value of the non-volatile configuration bits, whereas no separate selection bit is provided. In case the overall value is from a group of a plurality of predetermined values, then the desired interface channel is selected solely according to the non-volatile configuration bits. However, if the overall value of the non-volatile configuration bits does not equal any predetermined value from this group, then the desired interface channel is selected solely according to the voltage levels set at the configuration pins (disregarding the non-volatile configuration bits).

For example, in a flash memory array supporting three interface channels, the configuration bit sequence '00' can be set to define a USB interface channel, the configuration bit sequence '01' can be set to define an MMC interface channel, the configuration bit sequence '10' can be set to define a NAND interface channel, and the configuration bit sequence '11' can be set to select the desired interface channel solely according to the voltage level set at the related configuration pins.

Referring now to FIG. 1, there is shown a block diagram of the components comprising the proposed storage device, in accordance with a preferred embodiment of the present invention. The proposed storage device 10 comprises a flash memory array 14 containing a plurality of memory cells 16, defined as cells C1 to Cn. Non-volatile memory configuration bits are programmed to memory cells 16 C1 to Cn, wherein the configuration bit programmed to memory cell C1 is defined as a selection bit.

Controller 12 is configured to support n different interface channels. These n different interface channels define n+1 values, whereas n values out of the n+1 correspond to the n interface channels (programmed to memory cells C2 to Cn) and one value, defined herein as the "flexible" value, configures controller 12 to select the desirable interface channel solely according to the voltage level set at the configuration pins 18 (disregarding the non-volatile configuration bits).

In case the selection bit is set to the other "non-flexible" value, then controller 12 is configured to select the interface channel solely according to the value of configuration bit programmed to memory cells C2 to Cn (disregarding the functionality of the configuration pins).

Figure 2:
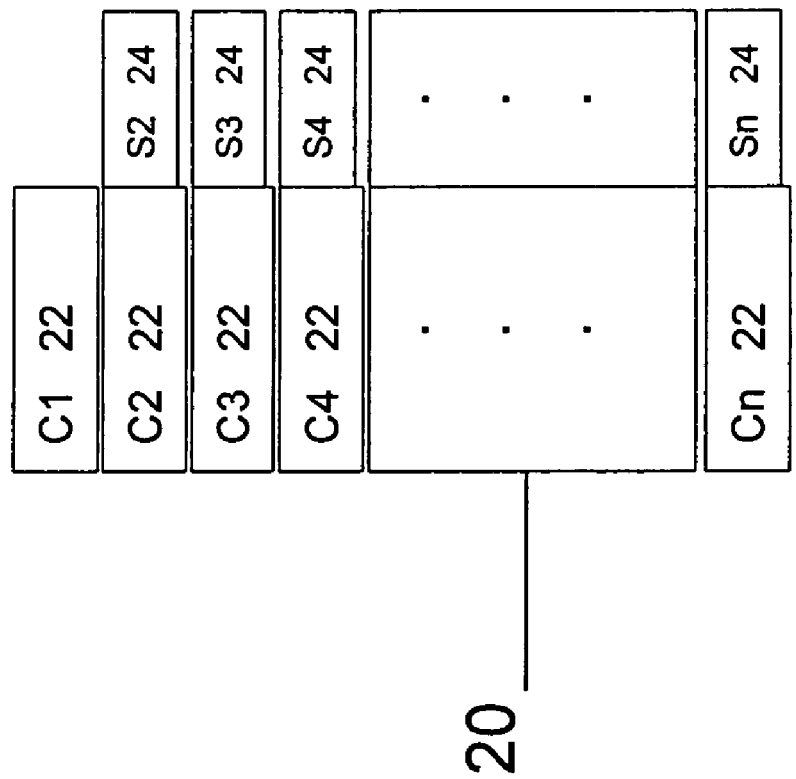
FIG. 2 shows a flash memory array containing a plurality of memory cells, wherein a "flag" is further provided in relation to each of the non-volatile memory configuration bits, in accordance with a second embodiment of the present invention.

Referring now to FIG. 2, there is shown the flash memory array 120 containing a plurality of memory cells 22, defined as units C1 to Cn. Non-volatile memory configuration bits are programmed to memory cells 22, wherein the configuration bit programmed to memory cell C1 is defined as a selection bit. A "flag" 24, defined as S2 to Sn, is further provided in relation to each of the non-volatile memory configuration bits programmed to memory cells C2 to Cn, in accordance with a second embodiment of the present invention. The value of "flag" 24 defines which one of the interface channel/s is operable.

In case the selection bit is set to the other "non-flexible" value, then a desired interface channel is selected from the operable interface channel/s according to the voltage level set at the configuration pins. Hence, the user is authorized to operate the controller via one interface channel selected only from the operable interface channel/s. However, in case the selection bit is set to the "flexible" value, then the desired interface channel is selected according to the voltage level at the configuration pins, wherein no restrictions are imposed on the selection.

For example, if a '1' value is set only to the flags S2, S5, and S6 referring to non-volatile memory configuration bits programmed to memory cells C2, C5, and C6, then the user is authorized to operate the controller via one interface channel selected from any of the interface channels programmed corresponding to memory cells C2, C5, and C6.

While the proposed storage device defines a selection bit for determining between the non-volatile memory configuration bits and the configuration pins, such a selection bit does not have to be defined within the present invention. The determination between the non-volatile memory configuration bits and the configuration pins may be further carried out according to the values of any configuration bit/s.

Figure 3:
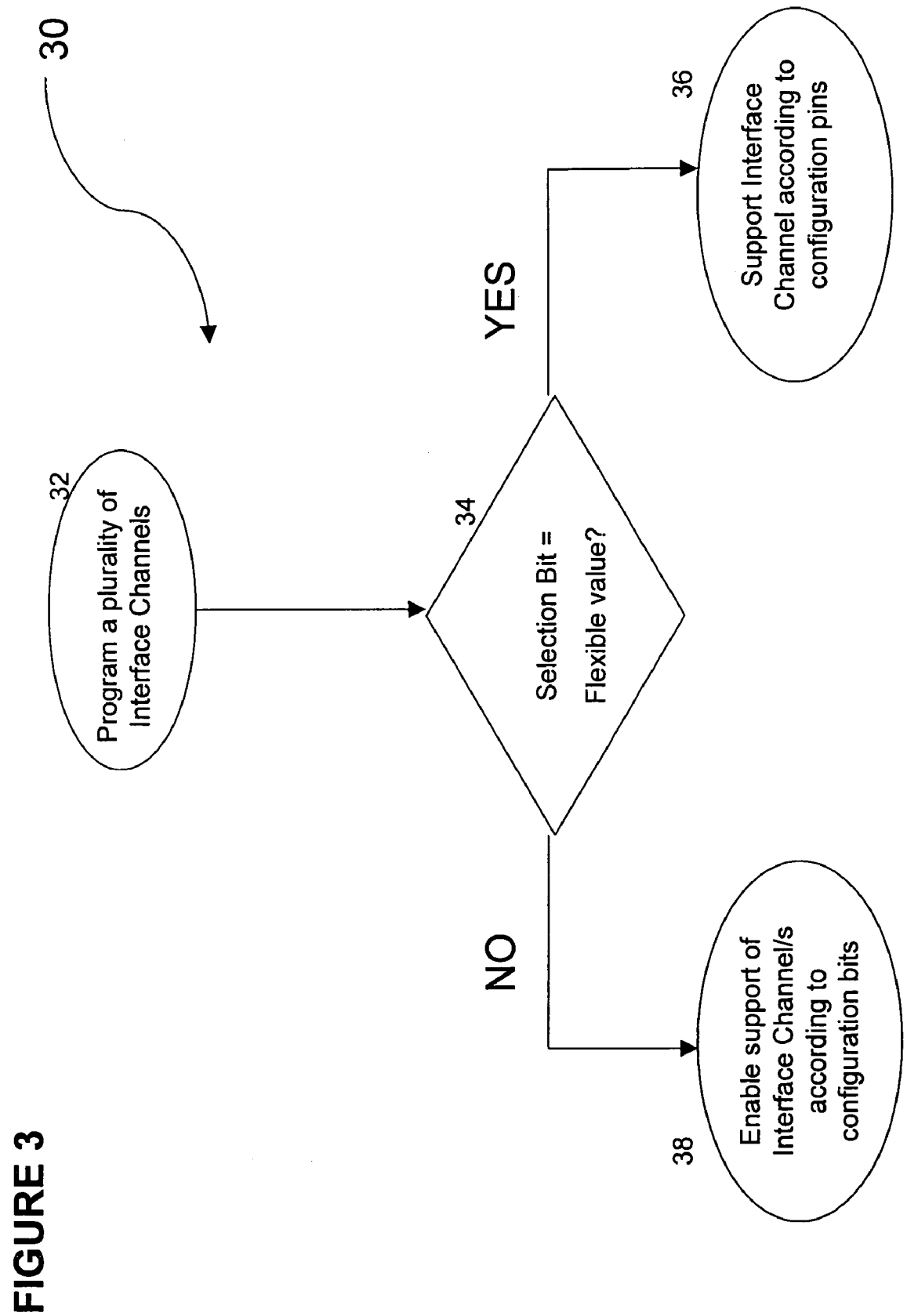
FIG. 3 shows a flow chart of the proposed method, in accordance with a preferred embodiment of the present invention.

FIG. 3 shows a flow chart 30 of the proposed method, in accordance with a preferred embodiment of the present invention. At the initial step 32, a plurality of interface channels are programmed to the non-volatile configuration bits and further set within the configuration pins.

At the next step 34, controller 12 measures whether selection bit C1 16 (see FIG. 1) is set to the "flexible value".

In case selection bit C1 16 is set to the "flexible" value (step 36), then controller 12 is configured to select the desired interface channel for connection to an external host according to the configuration pins only (disregarding the configuration bits).

However, if the value of selection bit C1 16 is set to any value other than the "flexible" value (step 38), then controller 12 is configured to select the desired interface channel for connection to an external host according to the values of the configuration bit/s (disregarding the voltage levels set at the configuration pins).

Implementing the proposed storage device in such a manner enables to accomplish the following scenarios:

A. Different pricing for different interface channels—the memory device manufacturer sets the configuration bits to MMC for selling a product supporting only the MMC interface channel (an MMC-only product) at one (e.g. high) price, and sets the configuration bits to USB for selling a USB-only product at another (e.g. low) price. The manufacturer is now guaranteed that every product sold will be used only according to the way it was configured by him.

B. Blocking a non-licensed interface channel—if a customer is not entitled to use the MMC interface channel (e.g. he is not a member of the MMCA organization that provides the license required for using an MMC interface channel), then the manufacturer sets the configuration bits to support the USB interface channel. The manufacturer is now guaranteed that a customer cannot use the interface channel he is not authorized to use.

C. Providing complete flexibility—if the memory device manufacturer wants to obtain complete manufacturing flexibility for his own internal product, such that the same memory device can be used in any product, then he sets the selection bit to the "flexible" value. The voltage levels applied to the configuration pins by the PCB wiring then configure the controller to support the mode specifically required for that product. The manufacturer thus enjoys a complete manufacturing flexibility that is not provided to his customers. Actually, the manufacturer may even elect to sell a fully-flexible product (in addition to the single-interface-limited products), charging for it a still higher price.

In accordance with the preferred embodiments of the present invention, in case the selection bit or the overall value of the non-volatile configuration bits (depending on the embodiment) are set to the "flexible" value—then the desired interface channel is selected solely according to the voltage level at the configuration pins. However, other embodiments are also possible within the scope of the invention, thus restricting the selection of the desired interface channel to be only in part according to the configuration pins (i.e. the selection is in part also determined according to the configuration bits).

It should be understood that while the proposed storage device disclosed herein employs a NAND-type flash memory, any other types of flash memories may be employed. Furthermore, other implementations are possible within the scope of the invention, thus relating to any device and method for flexibly configuring a controller and providing similar functionalities.

Having described the invention with regard to certain specific embodiments thereof, it is to be understood that the description is not meant as a limitation, since further modifications will now suggest themselves to those skilled in the art, and it is intended to cover such modifications as fall within the scope of the appended claims.

The invention claimed is:

1. A storage device comprising:
a flash memory array containing a plurality of memory cells, wherein at least two configuration bits are programmed to said plurality of memory cells; and
a controller for controlling said flash memory array, said controller comprising at least one configuration pin,
wherein said controller supporting a plurality of interface channels for connection to an external host,
wherein said controller is operative to select one interface channel from said plurality of interface channels, such that if a value of said at least two configuration bits is from a first group of at least one predetermined value then said interface channel is selected at least in part according to voltage levels measured at said at least one configuration pin,
whereas if said value is from a second group of at least one predetermined value then said interface channel is selected at least in part according to values of said at least two configuration bits.

2. The storage device of claim 1, wherein if said value of said at least two configuration bits is from said first group then said interface channel is selected solely according to voltage levels measured at said at least one configuration pin.

3. The storage device of claim 1, wherein if said value of said at least two configuration bits is from said second group then said interface channel is selected solely according to values of said at least two configuration bits.

4. The storage device of claim 1, wherein said first group contains one predetermined value.

5. The storage device of claim 1, wherein said first group contains a plurality of predetermined values.

6. The storage device of claim 1, having a one-to-one correspondence between said selected interface channel and said configuration bits.

7. The storage device of claim 1, wherein each of said plurality of interface channels is provided with a corresponding flag defining if each of said plurality of interface channels is operable, such that if said value of said at least two configuration bits is from said first group then said controller is operative to select said one interface channel only from at least one operable interface channel.

8. The storage device of claim 1, wherein said flash memory array and said controller are implemented on a single die.

9. The storage device of claim 1, wherein said flash memory array and said controller are implemented on separate dies.

10. The storage device of claim 1, wherein said flash memory array is a NAND flash memory array.

11. A system comprising:
a host processing unit; and
a storage device supporting a plurality of interface channels for connection to said host processing unit, said storage device comprising:
a flash memory array containing a plurality of memory cells,
wherein at least two configuration bits are programmed to said plurality of memory cells,
a controller for controlling said flash memory, said controller comprising at least one configuration pin, wherein said controller is operative to select one interface channel from said plurality of interface channels,
such that if a value of said at least two configuration bits is from a first group of at least one predetermined value then an interface channel is selected at least in part according to voltage levels measured at said at least one configuration pin,
whereas if said value is from a second group of at least one predetermined value then said interface channel is selected at least in part according to values of said at least two configuration bits.

12. A method for configuring a controller of a flash memory array that includes a plurality of memory cells, said method comprising the steps of:
programming at least two configuration bits to the plurality of memory cells; and
selecting one interface channel from a plurality of interface channels according to said at least two configuration bits and at least one configuration pin for connection to an external host,
such that if a value of said at least two configuration bits is from a first group of at least one predetermined value then said interface channel is selected at least in part according to voltage levels measured at said at least one configuration pin, whereas if said value is from a second group of at least one predetermined value then said interface channel is selected at least in part according to values of said at least two configuration bits.

13. The method of claim 12, wherein if said value of said at least two configuration bits is from said first group then said interface channel is selected solely according to voltage levels measured at said at least one configuration pin.

14. The method of claim 12, wherein if said value of said at least two configuration bits is from said second group then said interface channel is selected solely according to values of said at least two configuration bits.

15. The method of claim 12, wherein said first group contains one predetermined value.

16. The method of claim 12, wherein said first group contains a plurality of predetermined values.

17. The method of claim 12, having a one-to-one correspondence between said selected interface channel and said configuration bits.

18. The method of claim 12, wherein each of said plurality of interface channels is provided with a corresponding flag defining if each of said plurality of interface channels is operable, such that if said value of said at least two configuration bits is from said first group then the controller is operative to select said one interface channel only from at least one operable interface channel.

* * * * *